United States Patent
Miyagi et al.

(10) Patent No.: US 6,187,500 B1
(45) Date of Patent: Feb. 13, 2001

(54) POSITIVE PHOTORESIST COMPOSITIONS AND MULTILAYER RESIST MATERIALS USING SAME

(75) Inventors: Ken Miyagi; Kousuke Doi; Atsuko Hirata; Hidekatsu Kohara; Toshimasa Nakayama, all of Kanagawa (JP)

(73) Assignee: Tokyo Ohka Kogyo Co., Ltd., Kanagawa (JP)

( * ) Notice: Under 35 U.S.C. 154(b), the term of this patent shall be extended for 0 days.

(21) Appl. No.: 09/432,417

(22) Filed: Nov. 2, 1999

(30) Foreign Application Priority Data

Nov. 2, 1998 (JP) .................................................. 10-327466

(51) Int. Cl.$^7$ ..................................................... G03F 7/023
(52) U.S. Cl. .......................... 430/166; 430/191; 430/192; 430/193
(58) Field of Search ..................................... 430/166, 191, 430/192, 193

(56) References Cited

U.S. PATENT DOCUMENTS

| | | | | |
|---|---|---|---|---|
| 5,447,825 | * | 9/1995 | Nishi et al. | 430/326 |
| 5,529,880 | * | 6/1996 | Zampini et al. | 430/190 |
| 5,635,329 | * | 6/1997 | Nishi et al. | 430/192 |

* cited by examiner

*Primary Examiner*—John S. Chu
(74) *Attorney, Agent, or Firm*—Sughrue, Mion, Zinn, Macpeak & Seas, PLLC

(57) ABSTRACT

In a positive photoresist composition including (A) an alkali-soluble novolak resin and (B) a naphthoquinonediazide ester, the alkali-soluble novolak resin is obtained synthetically by condensation of phenol compounds and an aldehyde or ketone, and the phenol compounds include, for example, 1% to 20% by mole of hydroquinone, 30% to 95% by mole of m-cresol and 2% to 50% by mole of 2,5-xylenol. Thus, a high-definition positive photoresist composition can be obtained, which inhibits the formation of scum, and is satisfactory in sensitivity, sectional shape, focal depth range and other properties even in a process for the formation of an ultrafine resist pattern of 0.30 μm or below by lithography using i-ray.

11 Claims, 1 Drawing Sheet

POSITIVE PHOTORESIST COMPOSITIONS AND MULTILAYER RESIST MATERIALS USING SAME

BACKGROUND OF THE INVENTION

1. Field of the Invention

The present invention relates to a high-sensitivity and high-definition positive photoresist composition which is especially suitable for lithography using i-ray, and to a multilayer resist material using the composition.

2. Description of the Related Art

Positive photoresist compositions each containing an alkali-soluble resin and a quinonediazide ester have satisfactory definition, sensitivity, and etching resistance, and therefore have been applied in practice to the production of semiconductor devices and liquid crystal display devices.

With increasing demands for minitualized and high-capacity semiconductor integrated circuits (ICs), there is a strong felt need to form resist patterns in a design rule of 0.35 μm or below, more particularly 0.30 μm or below.

Even in such an ultrafine design rule, there are demands for photoresist compositions which can form resist patterns satisfactory in sensitivity, exposure margin, and focal depth range properties and having a good shape.

Such a resist pattern of 0.35 μm or below, in particular of 0.30 μm or below in line width, has been believed to be hardly formed by photolithography using i-ray (365 nm) as a light source without deteriorating the above properties. Photolithography using Kr-F excimer laser or Ar-F excimer layer which is shorter in wavelength than i-ray has therefore been proposed for the formation of such an ultrafine resist pattern.

Accordingly, a variety of photoresist compositions for excimer laser have been proposed.

The photolithography technique using excimer layer requires, however, expensive lithography systems and high costs in change of manufacturing lines, and the photoresist compositions for excimer laser are very fragile and need to be treated carefully.

Under these circumstances, demands have been made to provide means for sustaining the lithography technique using i-ray and to provide ultra-high definition photoresist compositions which can form an ultrafine resist pattern of 0.35 μm or below, particularly of 0.30 μm or below, in lithography using i-ray without deteriorating the definition, sectional shape or profile, focal depth range, and other properties.

A possible solution to the above demands is to improve alkali-soluble novolak resins to be used.

For example, Japanese Patent Laid-Open Nos. 6-202321 and 6-348007 disclose an alkali-soluble novolak resin containing units derived from m-cresol, p-cresol and 2,5-xylenol as constitutive units. The novolak resin is expected to prevent scum (resist residue after development) formation and to yield a positive photoresist composition satisfactory in definition, sectional profile, focal depth range and other properties. A photoresist composition using the novolak resin is, however, still insufficient in sensitivity, and if its sensitivity is to be increased by, for example, decreasing the molecular weight or increasing the proportion of m-cresol, the other properties, especially definition, are markedly deteriorated.

Japanese Unexamined Patent Publication No. 5-273757 discloses an alkali-soluble novolak resin obtained by condensing a mixture and formaldehyde, which mixture is composed of 30% to 98% by mole of m-cresol, 1% to 40% by mole of 3,5-dimethylphenol, and 1% to 10% by mole of polyhydroxyphenol represented by the following formula:

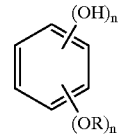

wherein R is a hydrogen or a lower alkyl group having 1 to 5 carbon atoms, and n denotes 1 to 3. The use of this novolak resin is expected to give a high-sensitivity positive photoresist composition satisfactory in heat resistance. Such a positive photoresist composition using the novolak resin invites, however, a large amount of scum, and is insufficient in definition, sectional profile, focal depth range and other properties, even though being satisfactory in sensitivity and heat resistance.

Furthermore, Japanese Patent Laid-Open No. 62-227144 discloses an alkali-soluble novolak resin obtained by condensation of phenols and formaldehyde, which phenols contain 6% to 94% by mole of m-cresol, and 94% to 6% of a compound represented by the following formula (except for m-cresol):

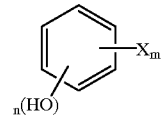

wherein X is —CH$_3$, —C$_2$H$_5$, —C(CH$_3$)$_3$, —CO$_2$CH$_3$ or —CO$_2$C$_2$H$_5$, 3≧n≧1, and 3≧m≧1. The use of this novolak resin is expected to give a positive photoresist composition satisfactory in definition, sensitivity, and heat resistance. A positive photoresist composition using the aforementioned novolak resin is, however, inferior in sensitivity and definition, invites a large amount of scum, and is inferior in sectional profile, focal depth range and other properties, in the formation of an ultrafine resist pattern of 0.35 μm or below.

SUMMARY OF THE INVENTION

Accordingly, it is an object of the present invention to provide a high-definition positive photoresist composition which inhibits the formation of scum, is satisfactory in sensitivity, sectional profile, focal depth range and other properties even in a process for the formation of a resist pattern of 0.35 μm or below, especially of an ultrafine pattern of 0.30 μm or below by photolithography using i-ray.

After intensive investigations, the present inventors have achieved a solution to the above problems of conventional equivalents.

To be more specific, the invention provides, in an aspect, a positive photoresist composition including: (A) an alkali-soluble novolak resin, and (B) a naphthoquinonediazide ester, the alkali-soluble novolak resin is obtained synthetically by condensation of phenol compounds and an aldehyde or ketone, and the phenol compounds are composed of 1% to 20% by mole of a phenol compound represented by the following formula (I):

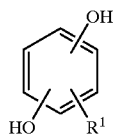
(I)

wherein $R^1$ is a hydrogen atom or an alkyl group having 1 to 5 carbon atoms, 30% to 95% by mole of m-cresol, and 2% to 50% by mole of 2,5-xylenol.

In the above photoresist composition, the phenol compound represented by the formula (I) may preferably be a resorcinol compound represented by the following formula (II):

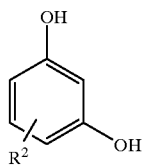
(II)

wherein $R^2$ is an alkyl group having 1 to 5 carbon atoms.

The phenol compound represented by the formula (I) may also be a hydroquinone compound represented by the following formula (III):

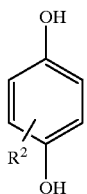
(III)

wherein $R^2$ is an alkyl group having 1 to 5 carbon atoms.

More preferably, the phenol compound represented by the formula (I) may be hydroquinone.

Alternatively, the phenol compound represented by the formula (I) may be at least one compound selected from the group consisting of 2-methylresorcinol, 5-methylresorcinol and 2-methylhydroquinone.

The aforementioned alkali-soluble novolak resin may further include 1% to 30% by mole of at least one phenol compound selected from the group consisting of p-cresol, 3,4-xylenol, 3,5-xylenol and dimethylol derivatives of these compounds, as the phenol compounds.

In the positive photoresist composition, 1% to 25% by mole of a phenol compound represented by the following formula (IV):

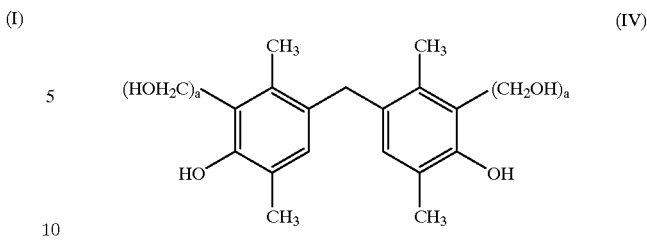
(IV)

wherein a denotes 0 or 1, is preferably used instead of 2,5-xylenol.

Further, the present invention provides a positive photoresist composition comprising:

(A) an alkali-soluble novolak resin, and
(B) a naphthoquinonediazide ester,
    characterized in that the alkali-soluble novolak resin comprises:
    1 to 20% of a unit represented by the following formula

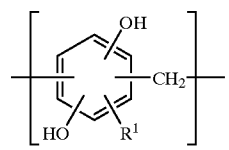

wherein $R^1$ is a hydrogen atom or an alkyl group having 1 to 5 carbon atoms,
30 to 95% of a unit represented by the following formula,

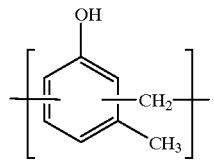

and 2 to 50% of a unit represented by the following formula.

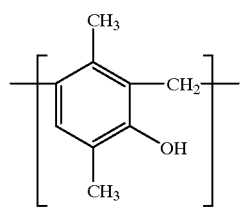

Furthermore, the present invention provides a positive photoresist composition comprising:

(A) an alkali-soluble novolak resin, and
(B) a naphthoquinonediazide ester,
    characterized in that the alkali-soluble novolak resin comprises:
    1 to 20% of a unit represented by the following formula

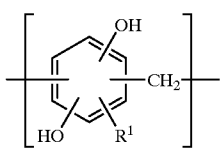

wherein $R^1$ is a hydrogen atom or an alkyl group having 1 to 5 carbon atoms,
30 to 95% of a unit represented by the following formula,

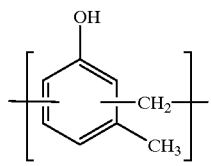

and 1 to 25% of a unit represented by the following formula.

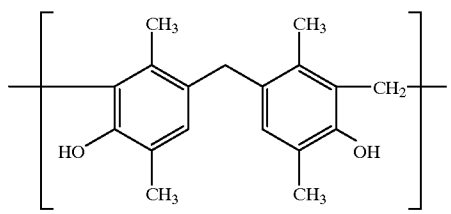

Still further, the present invention provides the above composition, wherein the alkali-soluble novolak resin further comprises, in the total units of the resin, 1 to 30% of at least one unit selected from units represented by the following formula:

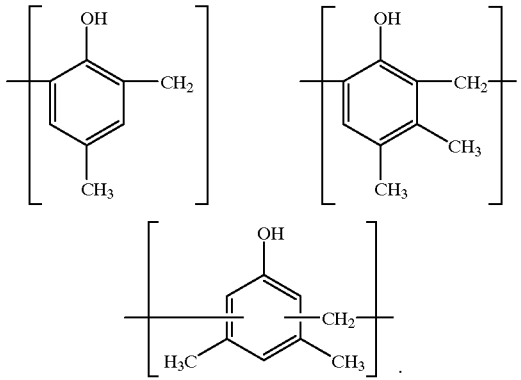

The invention also provides, in another aspect, a multi-layer resist material comprising a substrate, an anti-reflection coating formed on the substrate, and a positive photoresist layer formed on the anti-reflection coating, in which the positive photoresist layer is formed from the aforementioned positive photoresist composition.

Figure 1:
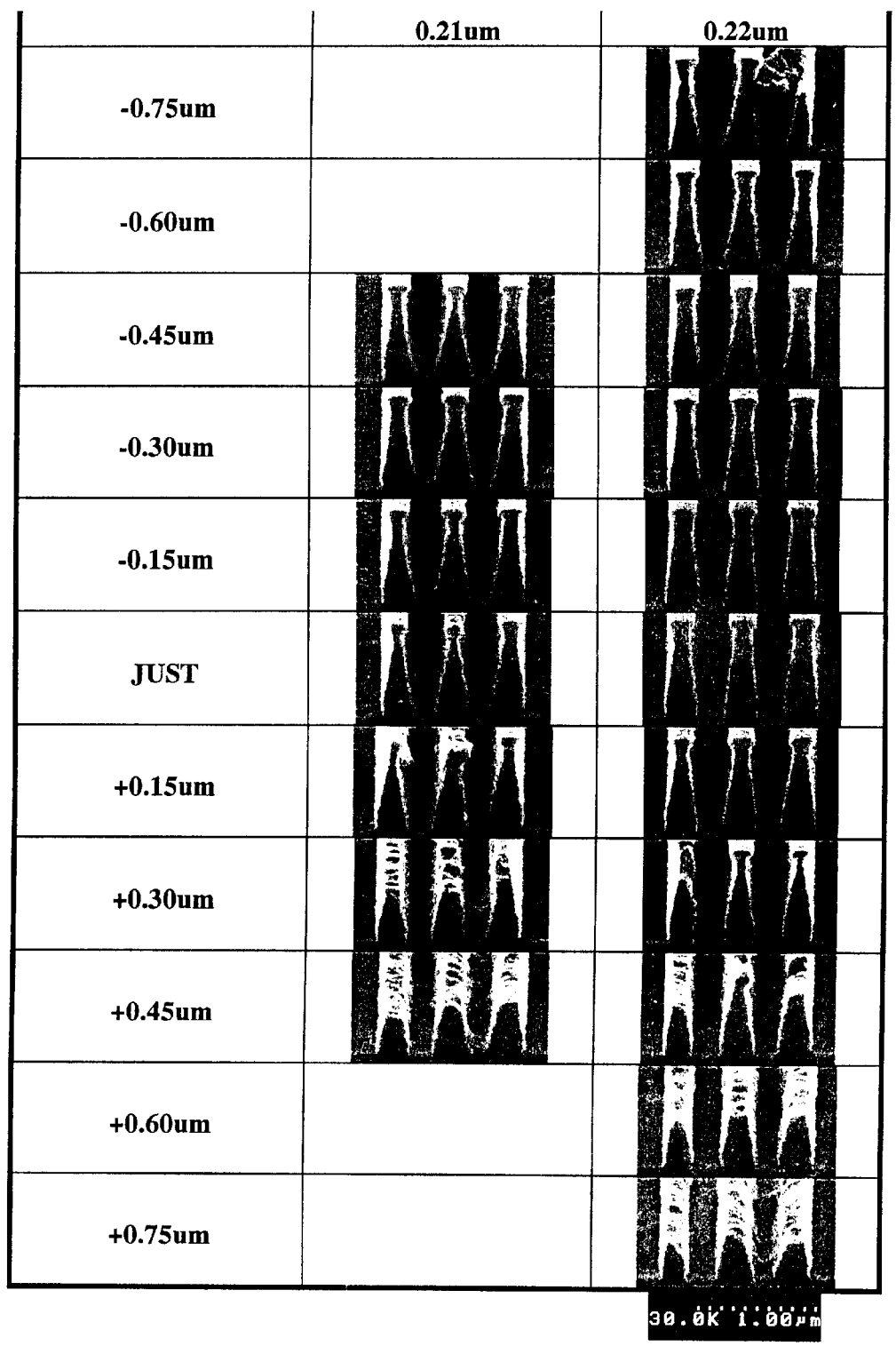
FIG. 1 is a cross sectional view of a resist pattern formed with the use of a composition according to Example 9 below.

DETAILED DESCRIPTION OF THE INVENTION (A) Alkali-soluble Novolak Resin

Alkali-soluble novolak resins used in the invention are obtained synthetically by using 1% to 20% by mole, preferably 3% to 15% by mole, of the phenol compound of the formula (I); 30% to 95% by mole, preferably 50% to 70% by mole, of m-cresol; and 2% to 50% by mole, preferably 10% to 40% by mole of 2,5-xylenol relative to the total mole of the phenol compounds to be used for the preparation of the novolak resin. When the compound of the formula (IV) is used instead of 2,5-xylenol, the proportion of the compound is 1% to 25% by mole, particularly 5% to 20% by mole.

If the proportion of the phenol compound of the formula (I) is less than 1% by mole, satisfactorily high sensitivity cannot be obtained, and if it exceeds 20% by mole, definition and the other properties are markedly deteriorated. When the proportion of m-cresol is less than 30% by mole, sensitivity is low, and if it exceeds 95% by mole, definition and the other properties are deteriorated. If the amount of 2,5-xylenol is less than 2% by mole, or that of the phenol compound of the formula (IV) is less than 1% by mole, scum forms in a large amount. To the contrary, the amount of 2,5-xylenol exceeds 50% by mole or that of the phenol compound of the formula (IV) exceeds 25% by mole, sensitivity and other properties are deteriorated.

The phenol compounds of the formula (I) include, for example, catechol, resorcinol, hydroquinone, 3-methylcatechol, 4-methylcatechol, 2-methylresorcinol, 4-methylresorcinol, 5-methylresorcinol, and 2-methylhydroquinone. Among them, resorcinol compounds of the formula (II) and hydroquinone compounds of the formula (III) are preferred. To be more specific, hydroquinone, 2-methylresorcinol, 5-methylresorcinol, and 2-methylhydroquinone are desirable for their satisfactory sensitivity, definition, heat resistance and other properties, of which hydroquinone is particularly desirable for its high definition.

To further improve the definition of the inventive photoresist composition, the phenol compounds to be used for the production of the alkali-soluble novolak resin preferably further comprise at least one compound selected from p-cresol, 3,4-xylenol, 3,5-xylenol, and dimethylol derivatives of these compounds. The proportion of the aforementioned at least one compound is 1% to 30% by mole, and preferably 5% to 20% by mole relative to the total mole of the phenol compounds to be used for the production of the novolak resin.

If the proportion of the above compound is less than 1% by mole, sufficient improvement in definition is not obtained, and if it exceeds 30% by mole, the sensitivity is deteriorated.

In addition to the above phenol compounds, the other phenol compounds can also be used for the production of the alkali-soluble novolak resin according to the invention. Examples of such additional phenol compounds include phenol; o-cresol; 2,3-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkylphenols; p-methoxyphenol, m-methoxyphenol, p-ethoxyphenol, m-ethoxyphenol, p-propoxyphenol, m-propoxyphenol, and other alkoxy-substituted phenols;

o-isopropenylphenol, p-isopropenylphenol, 2-methyl-4-isopropenylphenol, 2-ethyl-4-isopropenylphenol and other isopropenyl-substituted phenols; phenylphenol and other aryl-substituted phenols; and 4,4'-dihydroxybiphenyl, bisphenol A, pyrogallol, and other polyhydroxyphenols. Each of these compounds can be used singly or in combination.

To avoid adversely affecting the properties of the photoresist composition, the proportion of the additional phenol compounds is preferably equal to or less than 10% by mole relative to the total mole of the phenol compounds used for the production of the alkali-soluble novolak resin.

Any synthetic process such as bulk polymerization or solution polymerization, timing of the addition of individual phenol compounds, and reaction path can be employed for the production of the alkali-soluble novolak resin used in the invention, as far as individual phenol compounds are compounded in the target novolak resin in charged proportions, unreacted compounds are reduced, and the novolak resin can be obtained in high yield.

For instance, the novolak resin may preferably be synthetically obtained in the following manner: A phenol compound low in reactivity, such as p-cresol, is first dimethylolated, and the dimethylolated compound is then added gradually over a long period of time to large amounts of the other phenol compounds. In this way, the phenol compound low in reactivity can be compounded into a polymer skeleton. Alternatively, an oligomer containing a repeating unit of such a phenol compound low in reactivity is first synthesized, and the oligomer is subjected to condensation reaction with a phenol compound high in reactivity, such as m-cresol, using an aldehyde or ketone to give the novolak resin.

According to the above-mentioned synthetic method, a novolak resin substantially having a composition corresponding to a combination ratio of the phenol compounds can be obtained since unreacted phenol compounds and/or low-nuclear substances thereof, i.e., low-molecular weight substances having a molecular weight of about 200, are not substantially produced.

The alkali-soluble novolak resin used in the invention preferably has a dissolution rate ranging from 1 to 50 nm/sec., more preferably from 2 to 10 nm/sec. as a thin film in a 2.38% by weight tetramethylammonium hydroxide (TMAH) aqueous solution at 23° C.

If the dissolution rate is less than 1 nm/sec., the sensitivity is insufficient, and if it exceeds 50 nm/sec., the definition and the other properties are deteriorated.

The weight average molecular weight of the alkali-soluble novolak resin should preferably fall in the range from 2000 to 20000, and more preferably from 3000 to 15000. If it is less than 2000, film-forming property, heat resistance and other properties are deteriorated, and if it exceeds 20000, sensitivity is insufficient. The alkali-soluble novolak resin should preferably comprise no low molecular weight fraction. The removal of low molecular weight fractions can be conducted by, but is not limited to, the following manner. The novolak resin solution is dissolved in methyl amyl ketone (MAK), and the resultant solution is washed with water to remove a catalyst and unreacted compounds. To the residual is added a poor solvent such as hexane or heptane, or a hexane-MAK or heptane-MAK mixture, and the resultant mixture is stirred and then allowed to stand to separate a poor solvent layer containing low molecular weight fractions as a upper layer, and a MAK layer containing high molecular weight fractions as an lower layer. The lower layer is extracted to give a novolak resin having a higher molecular weight.

(B) Naphthoguinonediazide Ester

The ingredient (B) includes, but is not limited to, conventional esters of naphthoquinone-1,2-diazidesulfonic acid and a polyphenolic compound. Preferred examples of the polyphenolic compound include 2,4-bis(3,5-dimethyl-4-hydroxybenzyl)-5-hydroxyphenol, 2,6-bis(3,5-dimethyl-4-hydroxybenzyl)-4-methylphenol and other linear trinuclear compounds; bis[2,5-dimethyl-3-(4-hydroxy-5-methylbenzyl)-4-hydroxyphenyl]methane, bis[2,5-dimethyl-3-(2-hydroxy- 5-methylbenzyl)-4-hydroxyphenyl]methane, bis[2,5-dimethyl-3-(4-hydroxybenzyl)-4-hydroxyphenyl]methane, bis[2,5-dimethyl-3-(2,4-dihydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methyphenyl]methane and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexyiphenol and other linear pentanuclear compounds; and other linear polyphenolic compounds.

The ester can be obtained by, for example, condensing a naphthoquinone-1,2-diazidesulfonyl halide with the polyphenolic compound for complete or partial esterification. This condensation reaction is advantageously conducted in an organic solvent such as dioxane, N-methylpyrrolidone or dimethylacetamide, in the presence of a basic condensing agent including triethylamine, alkali carbonates and alkali hydrogencarbonates. As the ester of polyphenolic compound, use of an ester obtained by condensing not less than 50% by mole, preferably not less than 60% by mole of, for instance, naphthoquinone-1,2-diazide-4(or -5)-sulfonyl halide relative to the total mole of hydroxy groups in the polyphenolic compound (i.e., an ester having an esterification rate of not less than 50%, and preferably not less than 60%) is advantageous for still higher definition.

The inventive composition may further comprise, where necessary, a sensitizer (ingredient (C)), within the range not adversely affecting advantageous performances of the composition.

The ingredient (C) includes, but is not limited to, sensitizers (sense amplifiers) conventionally used for positive photoresist compositions.

Examples of the sensitizer include, in addition to the aforementioned polyphenolic compounds, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5- dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, 6-hydroxy-4a-(2,4-dihydroxyphenyl)-9-1'-spirocyclohexyl-1,2,3,4,4a,9a-hexahydroxanthene, 6-hydroxy-5-methyl-4a-(2,4-dihydroxy-3-methylphenyl)-9-1'-spirocyclohexyl-1,2,3,4,4a,9a-hexahydroxanthene and the like.

Of these compounds, 1,1-bis(4-hydroxyphenyl) cyclohexane, bis(4-hydroxy-3,5-dimethylphenyl)-3,4-dihydroxyphenylmethane, 2,6-bis(3,5-dimethyl-4-hydroxybenzyl)-4-methylphenol are preferred.

The content of the ingredient (C) should preferably fall in the range from 5% to 50% by weight and more preferably from 10% to 35% by weight relative to the weight of the alkali-soluble novolak resin, the ingredient (A).

In the inventive composition, the proportion of the ingredient (B) should preferably fall in the range of 10% to 60% by weight and more preferably 20% to 50% by weight relative to the total weight of the novolak resin, ingredient (A), and ingredient (C) added if desired. If the proportion of the ingredient (B) is excessively low, an image in exact accordance with a mask pattern can hardly be obtained and transfer (printing) property is liable to be deteriorated. On the contrary, if it is extremely high, the sensitivity and the uniformity of a resist film to be formed are deteriorated, resulting in a decreased definition. Each of these ingredients (B) can be used independently or in combination.

The inventive composition may further comprise, to improve definition, exposure margin and film residual rate, p-toluenesulfonyl chloride (PTSC), 4,4'-bis(diethylamino) benzophenone, 1,4-bis[1-(2-methyl-4-hydroxy-5-cyclohexylphenyl)isopropyl]benzene, and/or 1,3-bis[1-(2-methyl-4-hydroxy-5-cyclohexylphenyl)isopropyl]benzene, each in a proportion of about 0.01% to 10% by weight relative to the total weight of the composition.

In addition to the above specified ingredients, where necessary, the inventive composition may further comprise any of compatible additives including, for example, ultraviolet absorbents for inhibition of halation and surfactants for prevention of striation within ranges not adversely affecting the objects of the invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4'-diethylaminoazobenzene and curcumin. As the surfactants, there may be mentioned, for instance, Fluorade FC-430 and FC-431 (trade names, manufactured by Sumitomo 3M Ltd., Japan), F-TOP EF122A, EF122B, EF122C and EF126 (trade names, Tochem Products Ltd., Japan) and other fluorine-containing surfactants.

The inventive positive photoresist composition may preferably be used as a solution obtained by dissolving each of the above-specified ingredients in a proper solvent. Practical examples of the solvent include those used in conventional positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these solvents may be used solely or in combination. Of these solvents, typically preferred are acetone, methyl ethyl ketone, cyclohexanone, methyl isoamyl ketone, 2-heptanone and other ketones; and ethyl lactate, methyl acetate, ethyl acetate, butyl acetate, methyl pyruvate, ethyl pyruvate, methyl methoxypropionate, ethyl ethoxypropionate and other esters.

Practically, the composition may be used, for example, in the following manner: Each of the ingredients of the composition is dissolved in a proper solvent as mentioned above to give a coating solution; the coating solution is then applied, using a spinner, onto a substrate such as a silicon wafer, and subsequently is dried to form a photosensitive layer; next, the photosensitive layer is irradiated and exposed with an ultraviolet ray source such as a low-pressure mercury lamp, a high-pressure mercury lamp, or an ultra-high-pressure mercury lamp, through a photomask with a desired mask pattern; and the exposed areas of the film are then dissolved and removed by dipping in a developer solution, for example, an alkaline aqueous solution such as a 1% to 10% by weight tetramethylammonium hydroxide (TMAH) aqueous solution, thus forming an image (resist pattern) being in exact accordance with the mask pattern.

The invention also provides a multilayer resist material comprising a substrate, an anti-reflection coating on the substrate, and a positive photoresist layer on the anti-reflection coat. To be more specific, such a reflection coating is formed between a substrate and a photoresist layer to prevent deformation of the shape of a pattern due to reflected illumination from a substrate (support) such as a silicon wafer. According to this embodiment, the inventive composition can be applied more advantageously, and the advantages of the invention can further be enhanced. Thus, an ultrafine resist pattern of 0.25 µm or below, which is revolutionary for lithography using i-ray, can be formed. A technique for t he formation of an anti-reflection coating includes, but is not limited to, conventional bottom anti-reflection coating (BARC) techniques.

Materials for the anti-reflection coating a re not limited, and any known material can be used. Preferred examples of such materials include solutions obtained by dissolving a thermally cross-linkable triazine compound having a methylol group and/or alkoxy group and an ultraviolet absorbent, or further dissolving the composition just mentioned above and an alkali-insoluble acrylic resin, in an organic solvent.

The thermally cross-linkable triazine compound having a methylol group and/or alkoxy group includes melamine or guanamine having a methylol group and/or an alkoxymethyl group such as methoxymethyl, ethoxymethyl, propoxymethyl, or buthoxymethyl group.

These triazine compounds can be obtained according to a known method with facility, for example, by reacting melamine or guanamine with formalin in boiling water to give a methylolated compound, or further reacting the methylolated compound with a lower alcohol to give an alkoxylated compound. The triazine compounds are commercially available as a melamine which is substituted with 3.7 methoxymethyl groups on average (trade name: MX-750, produced by Sanwa Chamical Co., Ltd., Japan) and a melamine with is substituted with 5.8 methoxymethyl groups on average (trade name: MW-30, produced by Sanwa Chemical Co., Ltd., Japan).

As the ultraviolet absorbent, there may be mentioned 2,2',4,4'-tetrahydroxybenzophenone and curcumin, for example.

Preferred examples of the alkali-insoluble acrylic resin include polymers obtained from monomers such as methyl (meth)acrylate, ethyl (meth)acrylate, propyl (meth)acrylate and other alkyl (meth)acrylates, and glycidyl (meth)acrylate and having a weight average molecular weight of 10,000 to 100,000, and preferably 20,000 to 100,000. Of these polymers, copolymers of glycidyl methacrylate and methyl methacrylate in a weight ratio of 2:8 to 8:2 are desirable.

The anti-reflection coating can be formed by dissolving the above ingredients in a proper organic solvent to give a solution, and applying the solution onto the substrate, drying and baking the coating at a temperature of 100° C. to 300° C.

As organic solvents to be used in this procedure, those mentioned in the preparation of the aforementioned positive photoresist composition can be employed.

The substrate includes, for example, a silicon wafer, or a silicon wafer provided with a high-reflection film such as an aluminium film or a tungsten silicide film.

The inventive multilayer resist material, which is obtained by forming an anti-reflection coating on a substrate and forming a positive photoresist layer of the inventive composition on the anti-reflection coat, can be practically used in the following manner. The positive photoresist layer is formed, exposed and developed for patterning in the same manner as described above, and the anti-reflection coating is patterned by dry etching with, for example, chlorine gas, using the photoresist layer as a mask. In this connection, a conventional sillylation treatment can be conduced to prevent film reduction of the resist layer in dry etching.

EXAMPLES

The invention will be further illustrated in detail with reference to several inventive examples and comparative examples below.

Each of the characteristics of the positive photoresist compositions was evaluated according to the following manner, respectively.

[Sensitivity]

A sample was applied onto a silicon wafer using a spinner, and dried on a hot plate at 90° C. for 90 sec. to form a resist film 1.0 μm thick. The resist film was then irradiated for an increasing time period from 0.1 sec. at intervals of 0.01 sec., using a reducing-type projection aligner NSR-2005i10D (manufactured by Nikon corporation, Japan; NA=0.57). The film was then post-exposure baked (PEB) at 110° C. for 90 sec.; subjected to developing in a 2.38% by weight tetramethylammonium hydroxide (TMAH) aqueous solution at 23° C. for 60 sec., washed with water for 30 sec., and dried. In this procedure, the sensitivity was defined as the exposure time period (millisecond, ms) to give an exposed portion having a thickness of 0 after development.

[Definition]

The definition was defined as the critical definition at an exposure which reproduced a 0.35-μm line-and-space mask pattern.

[Focal Depth Range Properties]

A sample was subjected to exposure and development using a reducing-type projection aligner NSR-2005i10D (manufactured by Nikon Corporation, Japan; NA=0.57) at an exposure of Eop [the exposure time period to reproduce exactly predetermined mask pattern dimensions (line width: 0.30 μm, line-and-space (L&S): 1:1)] as a standard exposure, where the focus was shifted up and down at this exposure. The obtained resist pattern was subjected to a scanning electron microscopic (SEM) photographic observation. Based upon the SEM photograph, the focal depth range was defined as the maximum value (μm) of the focal shift (defocus) to obtain a 0.30-μm rectangular resist pattern with dimensional changes within the range of ±10% from the predetermined dimensions.

[Scum Evaluation]

The resist pattern after development was subjected to an SEM observation. Based upon this SEM observation, the scum (residue after development) of the surface of pattern was evaluated in accordance with the following criteria:

○: no scum observed

×: scum observed

Synthesis Example 1

Synthesis of Novolak Resin 1

To 200.0 g of gamma-butyrolactone were added 76.8 g (0.3 mole: 0.6 mole in terms of 2,5-xylenol unit) of a compound represented by the following formula (hereinafter referred to as "Compound A"):

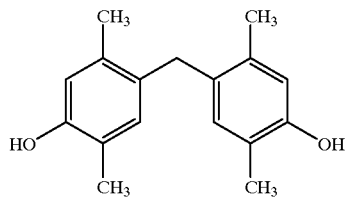

11.0 g (0.1 mole) of hydroquinone, and 5.0 g of p-toluenesulfonic acid, and the resultant mixture was heated to 95° C., and to this mixture, a solution of 33.6 g (0.2 mole) of a compound represented by the following formula (hereinafter referred to as "Compound B") dissolved in 200.0 g of gamma-butyrolactone was added dropwise over 30 minutes.

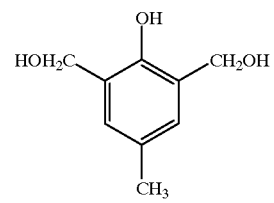

After the completion of addition, the resultant mixture was stirred for 3 hours to give a solution of a resin having a weight average molecular weight of 1480. Subsequently, 118.8 g (1.1 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 949.0 g of a 26.2% by weight solution of a novolak resin (weight average molecular weight: 3840) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 427.5 g of MAK was then added to 572.5 g of the novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 137.1 g of a MAK solution of a novolak resin (Novolak Resin 1) having a weight average molecular weight of 6650.

Synthesis Example 2
Synthesis of Novolak Resin 2

To 200.0 g of gamma-butyrolactone were added 76.8 g (0.3 mole: 0.6 mole in terms of 2,5-xylenol unit) of the Compound A, 12.4 g (0.1 mole) of 2-methylresorcinol, and 5.0 g of p-toluenesulfonic acid, and the resultant mixture was heated to 95° C., and to this mixture, a solution of 33.6 g (0.2 mole) of the Compound B in 200.0 g of gamma-butyrolactone was added dropwise over 30 minutes. After the completion of addition, the resultant mixture was stirred for 3 hours to give a solution of a resin having a weight average molecular weight of 1180. Subsequently, 118.8 g (1.1 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 990.5 g of a 25.5% by weight solution of a novolak resin (weight average molecular weight: 4050) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 411.8 g of MAK was then added to 588.2 g of the above novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 126.3 g of a MAK solution of a novolak resin (Novolak Resin 2) having a weight average molecular weight of 6790.

Synthesis Example 3
Synthesis of Novolak Resin 3

A mixture of 76.8 g (0.3 mole: 0.6 mole in terms of 2,5-xylenol unit) of the Compound A, 12.4 g (0.1 mole) of 5-methylresorcinol, 5.0 g of p-toluenesulfonic acid and 200.0 g of gamma-butyrolactone was heated to 95° C., and to this mixture, a solution of 33.6 g (0.2 mole) of the Compound B in 200.0 g of gamma-butyrolactone was added dropwise over 30 minutes. After the completion of addition, the resultant mixture was stirred for 3 hours to give a solution of a resin having a weight average molecular weight of 1160. Subsequently, 118.8 g (1.1 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 898.9 g of a 28.1% by weight solution of a novolak resin (weight average molecular weight: 3530) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 466.2 g of MAK was then added to 533.8 g of the above novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 116.7 g of a MAK solution of a novolak resin (Novolak Resin 3) having a weight average molecular weight of 7580.

Synthesis Example 4
Synthesis of Novolak Resin 4

A mixture of 76.8 g (0.3 mole: 0.6 mole in terms of 2,5-xylenol unit) of the Compound A, 12.4 g (0.1 mole) of 2-methylhydroquinone, 5.0 g of p-toluenesulfonic acid, and 200.0 g of gamma-butyrolactone was heated to 95° C., and to this mixture, a solution of 33.6 g (0.2 mole) of the Compound B in 200.0 g of gamma-butyrolactone was added dropwise over 30 minutes. After the completion of addition, the resultant mixture was stirred for 3 hours to give a solution of a resin having a weight average molecular weight of 1060. Subsequently, 118.8 g (1.1 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 925.2 g of a 27.3% by weight solution of a novolak resin (weight average molecular weight: 3780) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 450.5 g of MAK was then added to 549.5 g of the above novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 96.8 g of a MAK solution of a novolak resin (Novolak Resin 4) having a weight average molecular weight of 7450.

Synthesis Example 5
Synthesis of Novolak Resin 5

To 200.0 g of gamma-butyrolactone were added 76.8 g (0.3 mole: 0.6 mole in terms of 2,5-xylenol unit) of the Compound A, 22.0 g (0.2 mole) of hydroquinone, and 5.0 g of p-toluenesulfonic acid, and the resultant mixture was heated to 95° C., and to this mixture, a solution of 33.6 g (0.2 mole) of the Compound B in 200.0 g of gamma-butyrolactone was added dropwise over 30 minutes. After the completion of addition, the resultant mixture was stirred for 3 hours to give a solution of a resin having a weight average molecular weight of 1220. Subsequently, 108.0 g (1.0 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 974.7 g of a 25.4% by weight solution of a novolak resin (weight average molecular weight: 4620) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 409.4 g of MAK was then added to 590.6 g of the above novolak resin MAK solution to adjust the concentration to 15.0% by weight, and 870.0 g of n-heptane was added to the resultant solution to precipitate a resin. After removing an upper layer by decantation, 150 g of MAK was added to the resin layer for dissolution, and the solution was concentrated to give 68.2 g of a MAK solution of a novolak resin (Novolak Resin 5) having a weight average molecular weight of 8460.

Synthesis Example 6
Synthesis of Novolak Resin 6

A mixture of 51.2 g (0.2 mole: 0.4 mole in terms of 2,5-xylenol unit) of the Compound A, 44.0 g (0.4 mole) of hydroquinone, 5.0 g of p-toluenesulfonic acid, and 200.0 g of gamma-butyrolactone was heated to 95° C., and to this mixture, a solution of 33.6 g (0.2 mole) of the Compound B in 200.0 g of gamma-butyrolactone was added dropwise over 30 minutes. After the completion of addition, the resultant mixture was stirred for 3 hours to give a solution of a resin having a weight average molecular weight of 920. Subsequently, 108.0 g (1.0 mole) of m-cresol was added to the solution, followed by the dropwise addition of 81.1 g of 37% formaldehyde aqueous solution over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 961.8 g of a 24.7% by weight solution of a novolak resin (weight average molecular weight: 4760) in MAK.

As a result of GPC (Gel Permeation Chromatography), unreacted phenol compounds and low-molecular weight substances having a molecular weight of about 200 were not substantially detected and therefore it seemed that a novolak resin substantially having a composition corresponding to a combination ratio of the phenol compounds was produced.

A total of 392.7 g of MAK was then added to 607.3 g of the above novolak resin MAK solution to adjust the concentration to 15.0% by weight, and 825.0 g of n-heptane was added to the resultant solution to precipitate a resin. After removing an upper layer by decantation, 150 g of MAK was added to the resin layer for dissolution, and the solution was concentrated to give 70.5 g of a MAK solution of a novolak resin (Novolak Resin 6) having a weight average molecular weight of 9350.

Comparative Synthesis Example 1
Synthesis of Novolak Resin 7

A mixture of 86.4 g (0.8 mole) of m-cresol, 64.8 g (0.6 mole) of p-cresol, 73.2 g (0.6 mole) of 2,5-xylenol, 5.0 g of oxalic acid, and 330.0 g of gamma-butyrolactone was heated to 95° C., and to this mixture, 121.6 g of 37% formaldehyde aqueous solution was then added dropwise over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 950 g of a 24.1% by weight solution of a novolak resin (weight average molecular weight: 3750) in MAK.

As a result of GPC (Gel Permeation Chromatography), a large amount of low-molecular weight substances having a molecular weight of about 200 were detected and therefore it seemed that a novolak resin having a composition which differs from a combination ratio of the phenol compounds was produced.

A total of 377.6 g of MAK was then added to 622.4 g of the above novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 79.0 g of a MAK solution of a novolak resin (Novolak Resin 7) having a weight average molecular weight of 7320.

Comparative Synthesis Example 2
Synthesis of Novolak Resin 8

A mixture of 151.2 g (1.4 mole) of m-cresol, 48.8 g (0.4 mole) of 3,5-xylenol, 22.0 g (0.2 mole) of hydroquinone, 5.0 g of oxalic acid, and 330.0 g of gamma-butyrolactone was heated to 95° C., and to this mixture, 125.7 g of 37% formaldehyde aqueous solution was then added dropwise over 30 minutes. After the completion of addition, the resultant mixture was refluxed for 15 hours to conduct a reaction. After the completion of reaction, 200.0 g of pure water was added to the reaction mixture while stirring, and the mixture was then allowed to stand for 2 hours. The mixture was thus separated into two layers, an upper layer was removed by decantation, and 900.0 g of MAK was added to a residual resin layer for dissolution. The solution was washed with water three times to remove gamma-butyrolactone, and was concentrated to give 1120 g of a 22.1% by weight solution of a novolak resin (weight average molecular weight: 4050) in MAK.

As a result of GPC (Gel Permeation Chromatography), a large amount of low-molecular weight substances having a molecular weight of about 200 were detected and therefore it seemed that a novolak resin having a composition which differs from a combination ratio of the phenol compounds was produced.

A total of 321.3 g of MAK was then added to 678.7 g of the above novolak resin MAK solution to adjust the concentration to 15.0% by weight, and 900.0 g of n-heptane was added to the resultant solution to precipitate a resin. After removing an upper layer by decantation, 150 g of MAK was added to the resin layer for dissolution, and the solution was concentrated to give 97.0 g of a MAK solution of a novolak resin (Novolak Resin 8) having a weight average molecular weight of 7890.

Examples 1 to 6 and Comparative Examples 1 and 2

A series of positive photoresist compositions were prepared using each of the Novolak Resins 1 to 8 obtained in synthesis Examples 1 to 6 and Comparative Synthesis Examples 1 and 2 in the following charging ratios. The characteristics of the positive photoresist compositions were evaluated according to the aforementioned methods The results are shown in Table 1.

Ingredient (A): 100 parts by weight of a novolak resin

Ingredient (B): 55 parts by weight of an ester of 1 mole of a compound represented by the following formula, and 3 moles of 1,2-naphthoquinonediazide-5-sulfonyl chloride:

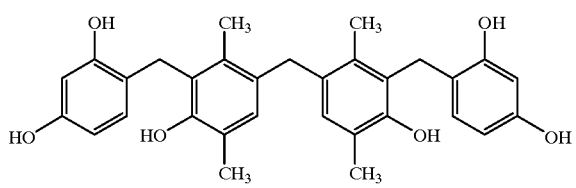

Ingredient (C): 30 parts by weight of a compound presented by the following formula:

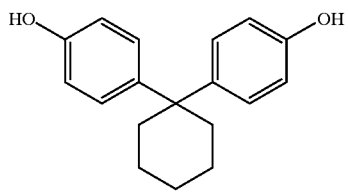

Ingredient (D): 4 parts by weight of a compound represented by the following formula:

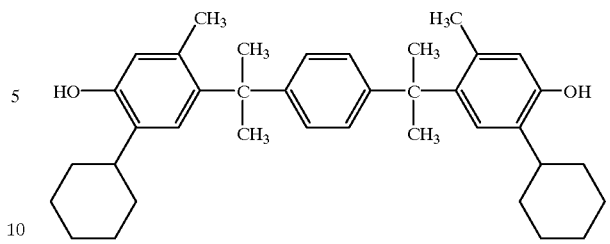

Solvent (E): 490 parts by weight of MAK (2-heptanone)

Example 7

A positive photoresist composition was prepared in the same manner as in Example 1, except that a compound represented by the following formula was used as the Ingredient (C), and its characteristics were then evaluated The results are shown in Table 1.

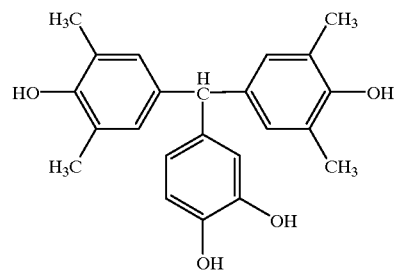

Example 8

A positive photoresist composition was prepared in the same manner as in Example 1, except that a compound represented by the following formula was used as the Ingredient (C), and was subjected to the evaluations The results are shown in Table 1.

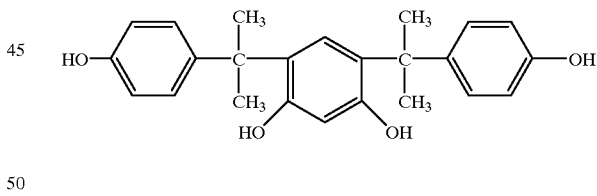

TABLE 1

| | Ingredient (A) [X*¹/m-cresol/2,5-xylenol/p-cresol] (Mw) | Sensitivity (ms) | Definition (μm) | Focal Depth Range Properties (μm) | Scum Evaluation |
|---|---|---|---|---|---|
| Ex. 1 | Novolak Resin 1 (5/55/30/10) (6650) | 200 | 0.25 | 1.0 | o |
| Ex. 2 | Novolak Resin 2 (5/55/30/10) (6790) | 230 | 0.28 | 1.0 | o |
| Ex. 3 | Novolak Resin 3 (5/55/30/10) (7580) | 230 | 0.28 | 1.0 | o |
| Ex. 4 | Novolak Resin 4 (5/55/30/10) (7450) | 230 | 0.28 | 1.0 | o |

TABLE 1-continued

| | Ingredient (A) [X*¹/m-cresol/2,5-xylenol/p-cresol] (Mw) | Sensitivity (ms) | Definition (μm) | Focal Depth Range Properties (μm) | Scum Evaluation |
|---|---|---|---|---|---|
| Ex. 5 | Novolak Resin 5 (10/50/30/10) (8460) | 180 | 0.30 | 0.9 | ○ |
| Ex. 6 | Novolak Resin 6 (20/50/20/10) (9350) | 110 | 0.32 | 0.8 | ○ |
| Ex. 7 | Novolak Resin 1 (5/55/30/10) (6650) | 190 | 0.25 | 1.0 | ○ |
| Ex. 8 | Novolak Resin 1 (5/55/30/10) (6650) | 190 | 0.25 | 1.0 | ○ |
| Com. Ex. 1 | Novolak Resin 7 (—/40/30/30) (7320) | 240 | 0.30 | 0.9 | ○ |
| Com. Ex. 2 | Novolak Resin 8 (10/70/—/20) (7890) | 270 | 0.30 | 0.4 | x |

*¹X represents a unit of one phenol compound represented by hydroquinone, 2-methylhydroquinone, 2-methylresorcinol and 5-methylresorcinol. The figures in the middle parenthesis represent mole percentages of each unit.

Table 1 demonstrate that the inventive compositions were satisfactory in all of sensitivity, definition, focal depth range properties and scum evaluation. Contrary to this, the compositions according to the comparative examples were not satisfactory in all these items.

Example 9

A positive photoresist composition was prepared using the Novolak Resin 1 obtained in the Synthesis Example 1, in the following charging ratios.

Ingredient (A): 100 parts by weight of the Novolak Resin 1

Ingredient (B): 65 parts by weight of the ester used in Example 1

Ingredient (C-1): 20 parts by weight of a compound represented by the following formula:

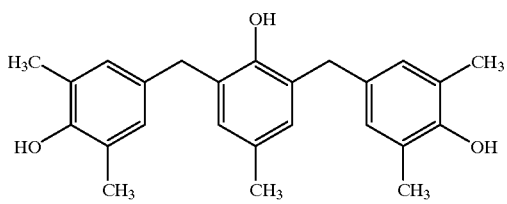

Ingredient (C-2): 10 parts by weight of a compound represented by the following formula:

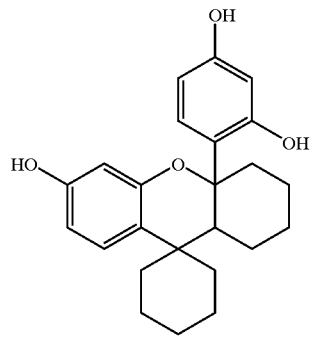

Ingredient (D-1): 6 parts by weight of a compound represented by the following formula:

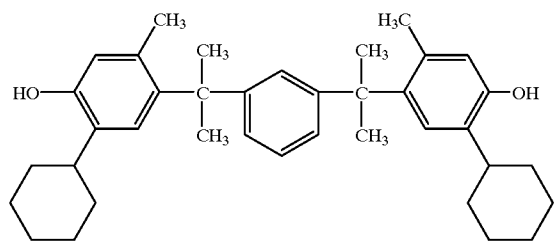

Ingredient (D-2): 0.4 part by weight of p-toluenesulfonyl chloride

Solvent (E): 490 parts by weight of MAK (2-heptanone)

The characteristics of the positive photoresist composition obtained in Example 9 were evaluated in the following manner. The results are shown in Table 2.

[Sensitivity]

A sample was applied onto a silicon wafer having an anti-reflection coating, using a spinner, and dried on a hot plate at 90° C. for 90 sec. to form a resist film 0.74 μm thick. The resist film was then irradiated for an increasing time period from 0.1 sec. at intervals of 0.01 sec., using a reducing-type projection aligner NSR-2005i10D (manufactured by Nikon Corporation, Japan; NA=0.57). The film was then post-exposure baked (PEB) at 110° C. for 90 sec.; subjected to developing in a 2.38% by weight tetramethylammonium hydroxide (TMAH) aqueous solution at 23° C. for 60 sec., washed with water for 30 sec., and dried. In this procedure, the sensitivity was defined as the exposure time period (millisecond, ms) to give an exposed portion having a thickness of 0 after development.

[Definition]

The definition was defined as the critical definition at an exposure which reproduced a 0.25-μm line-and-space (L&S) mask pattern.

[Focal Depth Range Properties]

A sample was subjected to exposure and development using a reducing-type projection aligner NSR-2005i10D (manufactured by Nikon Corporation, Japan; NA=0.57) at an exposure of Eop [the exposure time period to reproduce exactly predetermined dimensions of a mask pattern (line width: 0.25 μm, line-and-space (L&S): 1:1)] as a standard exposure, where the focus was shifted up and down at this exposure. The obtained resist pattern was subjected to an scanning electron microscopic (SEM) photographic observation. Based upon the SEM photograph, the focal depth range was defined as the maximum value (μm) of the focal shift (defocus) to obtain a 0.25-μm rectangular resist pattern with dimensional changes within the rang of ±10% from the predetermined dimensions.

[Scum Evaluation]

The evaluation was conducted in the same manner as in Example 1.

In Example 9, an anti-reflection coating was formed on a silicon wafer in the following manner:

A material for an anti-reflection coating (trade name: SWK T5 D60, available from Tokyo Ohka Kogyo Co., Ltd., Japan) was applied onto a silicon wafer, dried and then baked at 180° C. to give an anti-reflection coating 150 nm thick.

TABLE 2

| Ingredient (A) [X*²/m-cresol/2,5-xylenol/p-cresol] (Mw) | Sensi- tivity (ms) | Defini- tion (μm) | Focal Depth Range Properties (μm) | Scum Evalua- tion |
|---|---|---|---|---|
| Ex. 9 | Novolak Resin 1 (5/55/30/10) (6650) | 170 | 0.20 | 1.5 | ○ |

*²X represents hydroquinone

Separately, a resist pattern was formed by using the composition obtained in Example 9, and an electron micrograph of the sectional shape of the resist pattern is shown in FIG. 1.

The resist pattern was formed in the following manner.

A sample was applied onto a silicon wafer having an anti-reflection coating, using a spinner, and dried on a hot plate at 90° C. for 90 sec. to form a resist film 0.74 μm thick. The resist film was then irradiated for an increasing time period from 0.1 sec. at intervals of 0.01 sec., using a reducing-type projection aligner NSR-2005i10D (manufactured by Nikon Corporation, Japan; NA=0.57) at an exposure of Eop [the exposure time period to form 0.25 μm line width, line-and-space (L&S) width of 1:1)]. The film was then post-exposure baked (PEB) at 110° C. for 90 sec.; subjected to developing in a 2.38% by weight tetramethylammonium hydroxide (TMAH) aqueous solution at 23° C. for 60 sec., washed with water for 30 sec., and dried to give a resist pattern.

In FIG. 1, the abscissa represents a mask pattern size, and the ordinate represents a focal depth.

FIG. 1 shows that the focal depth rage decreased with a decreasing mask pattern size. According to Example 9, an isolated pattern could be formed and sufficient focal depth range was obtained even at a mask pattern size of 0.21 μm. The critical definition was 0.20 μm. This critical definition is a revolutionary ultrahigh definition as compared with conventional equivalents for i-ray lithography. According to conventional techniques, such an ultrahigh definition can only be obtained by lithography using excimer laser.

According to the invention, a high-definition positive photoresist composition can be obtained, which inhibits the formation of scum, and is satisfactory in sensitivity, sectional profile, focal depth range and other properties even in a process for the formation of a resist pattern of 0.35 μm or below, especially of an ultrafine resist pattern of 0.30 μm or below by lithography using i-ray.

Other embodiments and variations will be obvious to those skilled in the art, and this invention is not to be limited to the specific matters stated above.

What is claimed is:

1. A positive photoresist composition comprising:

(A) an alkali-soluble novolak resin, and (B) a naphthoquinonediazide ester, said alkali-soluble novolak resin being obtained synthetically by condensation of phenol compounds and an aldehyde or ketone, and said phenol compounds being composed of 1% to 20% by mole of a phenol compound represented by the following formula (I):

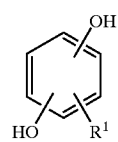

(I)

wherein $R^1$ is a hydrogen atom or an alkyl group having 1 to 5 carbon atoms, 30% to 95% by mole of m-cresol, and 2% to 50% by mole of 2,5-xylenol.

2. A composition according to claim 1, wherein said phenol compound represented by the formula (I) is a resorcinol compound represented by the following formula (II):

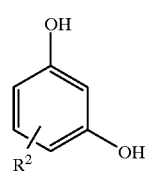

(II)

wherein $R^2$ is an alkyl group having 1 to 5 carbon atoms.

3. A composition according to claim 1, wherein said phenol compound represented by the formula (I) is a hydroquinone compound represented by the following formula (III):

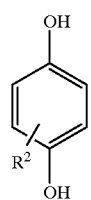

(III)

wherein $R^2$ is an alkyl group having 1 to 5 carbon atoms.

4. A composition according to claim 1, wherein said phenol compound represented by the formula (I) is hydroquinone.

5. A composition according to claim 1, wherein said phenol compound represented by the formula (I) is at least one compound selected from the group consisting of 2-methylresorcinol, 5-methylresorcinol and 2-methylhydroquinone.

6. A composition according to claim 1, wherein said alkali-soluble novolak resin further comprises 1% to 30% by mole of at least one phenol compound selected from the group consisting of p-cresol, 3,4-xylenol, 3,5-xylenol and dimethylol derivatives of these compounds, as said phenol compounds.

7. A composition according to claim 1, wherein 1% to 25% by mole of a phenol compound represented by the following formula (IV):

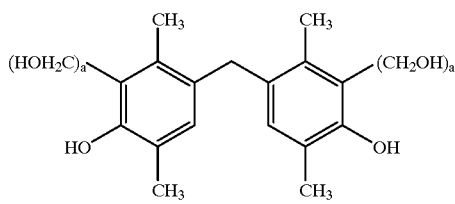

(IV)

wherein a denotes 0 or 1, is used instead of 2,5-xylenol.

8. A positive photoresist composition comprising:

(A) an alkali-soluble novolak resin, and
(B) a naphthoquinonediazide ester, said alkali-soluble novolak resin comprising:

1 to 20% of a unit represented by the following formula

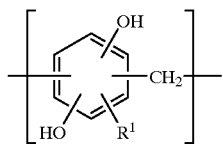

wherein $R^1$ is a hydrogen atom or an alkyl group having 1 to 5 carbon atoms, 30 to 95% of a unit represented by the following formula,

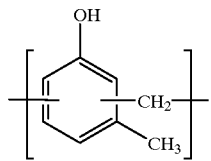

and 2 to 50% of a unit represented by the following formula.

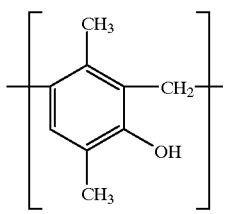

9. A positive photoresist composition comprising:

(A) an alkali-soluble novolak resin, and
(B) a naphthoquinonediazide ester, said alkali-soluble novolak resin comprising:

1 to 20% of a unit represented by the following formula

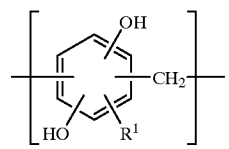

wherein $R^1$ is a hydrogen atom or an alkyl group having 1 to 5 carbon atoms, 30 to 95% of a unit represented by the following formula,

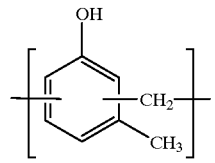

1 to 25% of a unit represented by the following formula.

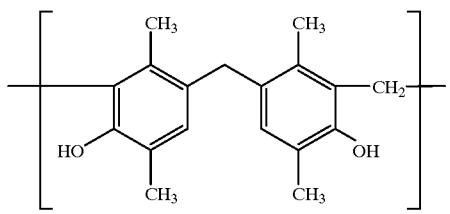

10. A composition according to claim 8, wherein said alkali-soluble novolak resin further comprises, in the total units of said resin, 1 to 30% of at least one unit selected from units represented by the following formula:

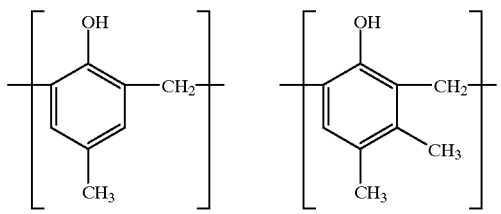

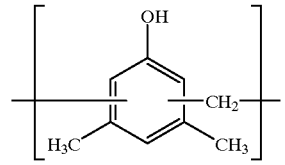

11. A multilayer resist material comprising a substrate, an anti-reflection coating formed on said substrate, and a positive photoresist layer formed on said anti-reflection coating characterized in that said positive photoresist layer is formed from a positive photoresist composition described in claim 1.

* * * * *

UNITED STATES PATENT AND TRADEMARK OFFICE
CERTIFICATE OF CORRECTION

PATENT NO. : 6,187,500 B1
DATED : February 13, 2001
INVENTOR(S) : Ken Miyagi, Kousuke Doi, Atsuko Hirata, Hidekatsu Kohara and Toshimasa Nakayama It is certified that error appears in the above-identified patent and that said Letters Patent is hereby corrected as shown below:

Column 23,
Line 33 (claim 8), please change "car bon" to -- carbon --; and

Column 24,
Line 22 (claim 9), please change "1 to 25%" to -- and 1 to 25% --.

Signed and Sealed this

Second Day of October, 2001

Attest:

NICHOLAS P. GODICI
*Attesting Officer*     *Acting Director of the United States Patent and Trademark Office*